(12) United States Patent
Shih

(10) Patent No.: US 7,705,435 B2
(45) Date of Patent: Apr. 27, 2010

(54) LEAD FRAME STRUCTURE OF LIGHT EMITTING DIODE

(75) Inventor: Hsiang-Chih Shih, Tainan County (TW)

(73) Assignee: Chi Mei Lighting Technology Corp., Tainan County (TW)

( * ) Notice: Subject to any disclaimer, the term of this patent is extended or adjusted under 35 U.S.C. 154(b) by 18 days.

(21) Appl. No.: 11/696,723

(22) Filed: Apr. 4, 2007

(65) Prior Publication Data
US 2008/0169540 A1    Jul. 17, 2008

(30) Foreign Application Priority Data
Jan. 17, 2007    (TW) ............... 96101833 A

(51) Int. Cl.
*H01L 23/495*    (2006.01)
*H01L 33/00*    (2006.01)

(52) U.S. Cl. ............... 257/676; 257/E33.001; 257/E23.031; 257/E33.072

(58) Field of Classification Search ........... 257/676, 257/E33.001, E23.031, E33.072
See application file for complete search history.

(56) References Cited

U.S. PATENT DOCUMENTS

| | | | |
|---|---|---|---|
| 6,588,132 B2 * | 7/2003 | Tsuji | 40/451 |
| 7,304,326 B2 * | 12/2007 | Suehiro et al. | 257/79 |
| 7,347,603 B2 * | 3/2008 | Ikeda et al. | 362/555 |
| 2004/0046242 A1 * | 3/2004 | Asakawa | 257/678 |
| 2007/0001187 A1 * | 1/2007 | Kim | 257/98 |
| 2008/0048201 A1 * | 2/2008 | Kim et al. | 257/98 |
| 2008/0073662 A1 * | 3/2008 | Wang et al. | 257/99 |
| 2008/0111148 A1 * | 5/2008 | Zimmerman | 257/98 |
| 2009/0014745 A1 * | 1/2009 | Wang et al. | 257/98 |

FOREIGN PATENT DOCUMENTS

KR        2005111298 A    * 11/2005

* cited by examiner

*Primary Examiner*—Alexander O Williams
(74) *Attorney, Agent, or Firm*—WPAT, P.C.; Anthony King

(57) ABSTRACT

A lead frame structure of a light emitting diode is disclosed. The lead frame structure comprises a bonding zone, two wing-shaped reflective surfaces, a first electrode lead, and a second electrode lead. The first electrode lead and the second electrode lead are respectively connected to the bonding zone. The bonding zone bonds the light emitting diode. The reflective surfaces are formed on both sides of the bonding zone. A predetermined angle is formed between the bonding zone and the wing-shaped reflective surfaces for reflecting the side light emitted from the light emitting diode towards a predetermined direction.

16 Claims, 6 Drawing Sheets

LEAD FRAME STRUCTURE OF LIGHT EMITTING DIODE

RELATED APPLICATIONS

This application claims priority to Taiwan Application Serial Number 96101833, filed Jan. 17, 2007, which is herein incorporated by reference.

FIELD OF THE INVENTION

This invention relates to a lead frame structure of a light emitting diode, and more particularly, to a lead frame structure of a light emitting diode having a plurality of wing-shaped reflective surfaces.

BACKGROUND OF THE INVENTION

A light emitting diode (LED) has a low working voltage, low power loss, high light emitting efficiency, short response time, pure light color, sturdy structure, high impact resistance, high vibration endurance, stable performance, light weight, small volume and low cost. The promotion of the technology has helped to increase the brightness of the LED, and the LEDs are being used in increasingly diverse applications such as large-scale display screen, status indication, symbol lighting, signal display, backlight of a liquid crystal display (LCD) and lighting in car.

The conventional LED base is formed by an injection molding process to combine a lead frame, thereby forming a package structure. The lead frame is electrically connected to the electrode of the LED chip. The base is formed by an injection molding process to package the LED chip and hold the lead frame, wherein a recessed zone is formed in the base to dispose the LED chip.

However, in the package structure of the conventional LED, the recessed zone is defined by the base formed by injection molding, and an opening is formed in the base, so that the extractive light emitted from the LED chip can form a regular circular shape. The material of the base is heat-resistant and not pervious to light, such as polyphthalamide (PPA). When the LED is on, part of the light is not directly emitted out through the opening, but emitted inside the base, e.g. toward the side wall of the base, then absorbed, reflected or scattered on the side wall. Only a little light emitted toward the side wall can pass through the opening, and most light is absorbed by the material of the base, so that the light emitting efficiency is reduced by the base.

SUMMARY OF THE INVENTION

Therefore, an aspect of the present invention is to provide a lead frame structure of a light emitting diode to reflect the light emitted towards the side of the light emitting diode in a predetermined direction, thereby raising the light emitting efficiency thereof.

Another aspect of the present invention is to provide a lead frame structure of a light emitting diode to form a predetermined light shape emitted from the light emitting diode, such as an ellipse. Another aspect of the present invention is to provide a lead frame structure of a light emitting diode to raise the light emitting efficiency, thereby reducing the number of the light emitting diodes but maintaining the same brightness as a backlight source.

According to an embodiment of the present invention, the lead frame structure of the light emitting diode comprises a bonding zone, two wing-shaped reflective surfaces, a first electrode lead, and a second electrode lead. The bonding zone bonds the light emitting diode. The wing-shaped reflective surfaces are formed on two sides of the bonding zone respectively, wherein a predetermined angle is formed between each of the wing-shaped reflective surfaces and the bonding zone to reflect the light emitted towards the side of the light emitting diode towards a predetermined direction. The first electrode lead is connected to one side of the bonding zone to electrically connect to the light emitting diode. The second electrode lead is connected to another side of the bonding zone to be electrically connected to the light emitting diode.

According to another embodiment of the present invention, the lead frame of the light emitting diode of the present invention is combined with a base body to form a package base.

According to another embodiment of the present invention, the lead frame of the light emitting diode of the present invention has a plurality of wing-shaped reflective surfaces disposed around the bonding zone.

Therefore, with the application of the lead frame of the light emitting diode disclosed in the embodiments of the present invention, the side light emitted from the light emitting diode can be reflected in a predetermined direction, thereby preventing that part of the emitting light from being absorbed or lost, and raising the light emitting efficiency greatly. Besides, the lead frame of the present invention is combined with a base body to form a package base with a high reflectivity material layer, thereby further reflecting the light emitted towards the side of the light emitting diode. Furthermore, a plurality of wing-shaped reflective surfaces are disposed around the bonding zone to reflect the light in a predetermined direction or a predetermined area.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In order to make the illustration of the present invention more explicit and complete, the following description is stated with reference to FIG. 1 through FIG. 6.

A lead frame 100 of a light emitting diode 200 of the present invention holds the light emitting diode 200. The lead frame 100 is combined with a base body 300, thereby forming a package base 400 for packaging the light emitting diode 200, wherein the base body 300 is formed by injection molding, so as to combine with the lead frame 100 to form a package base 400.

Figure 1:
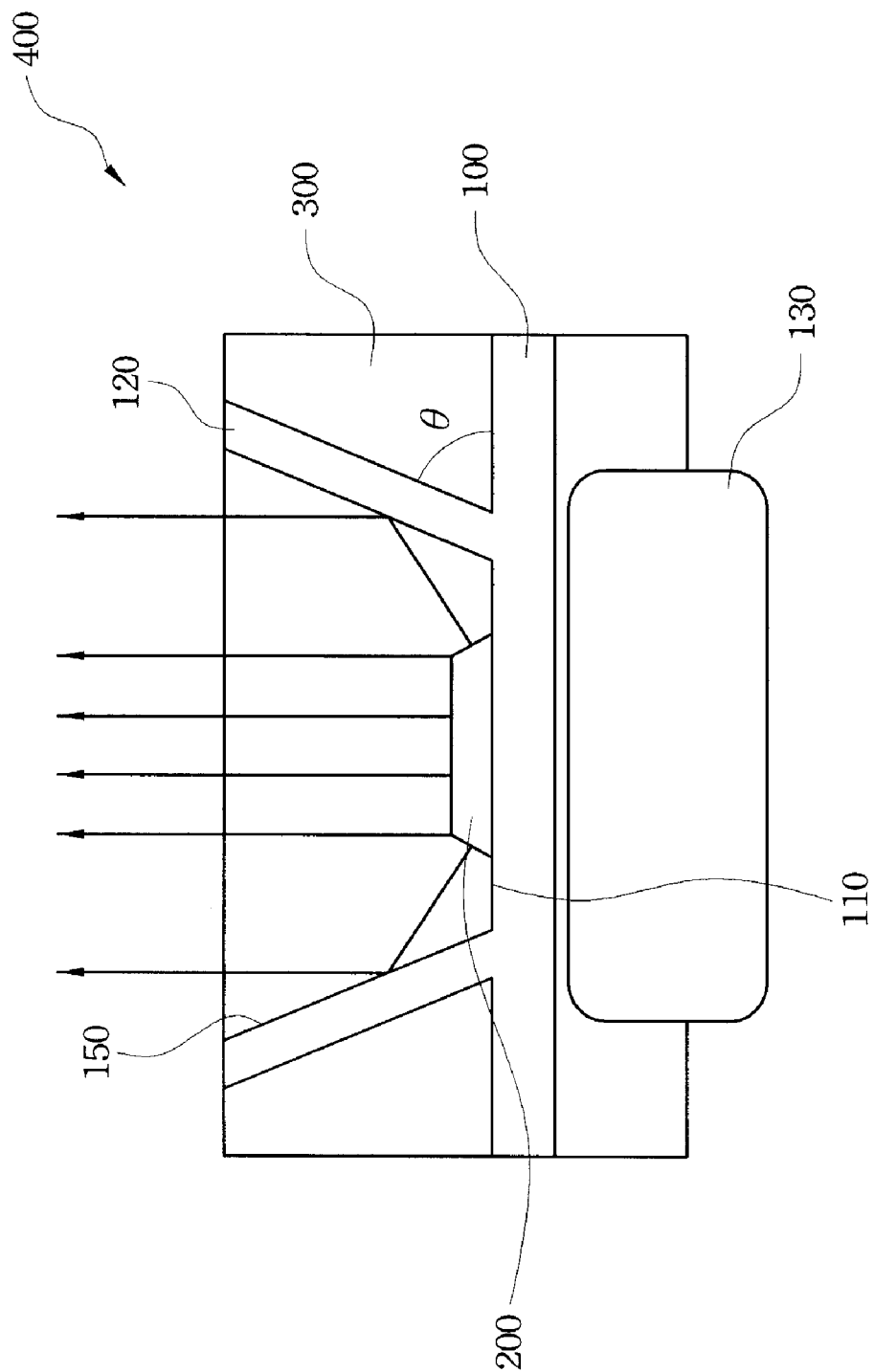
FIG. 1 is a cross-sectional view showing a lead frame structure of a light emitting diode according to a first embodiment of the present invention.
Figure 2:
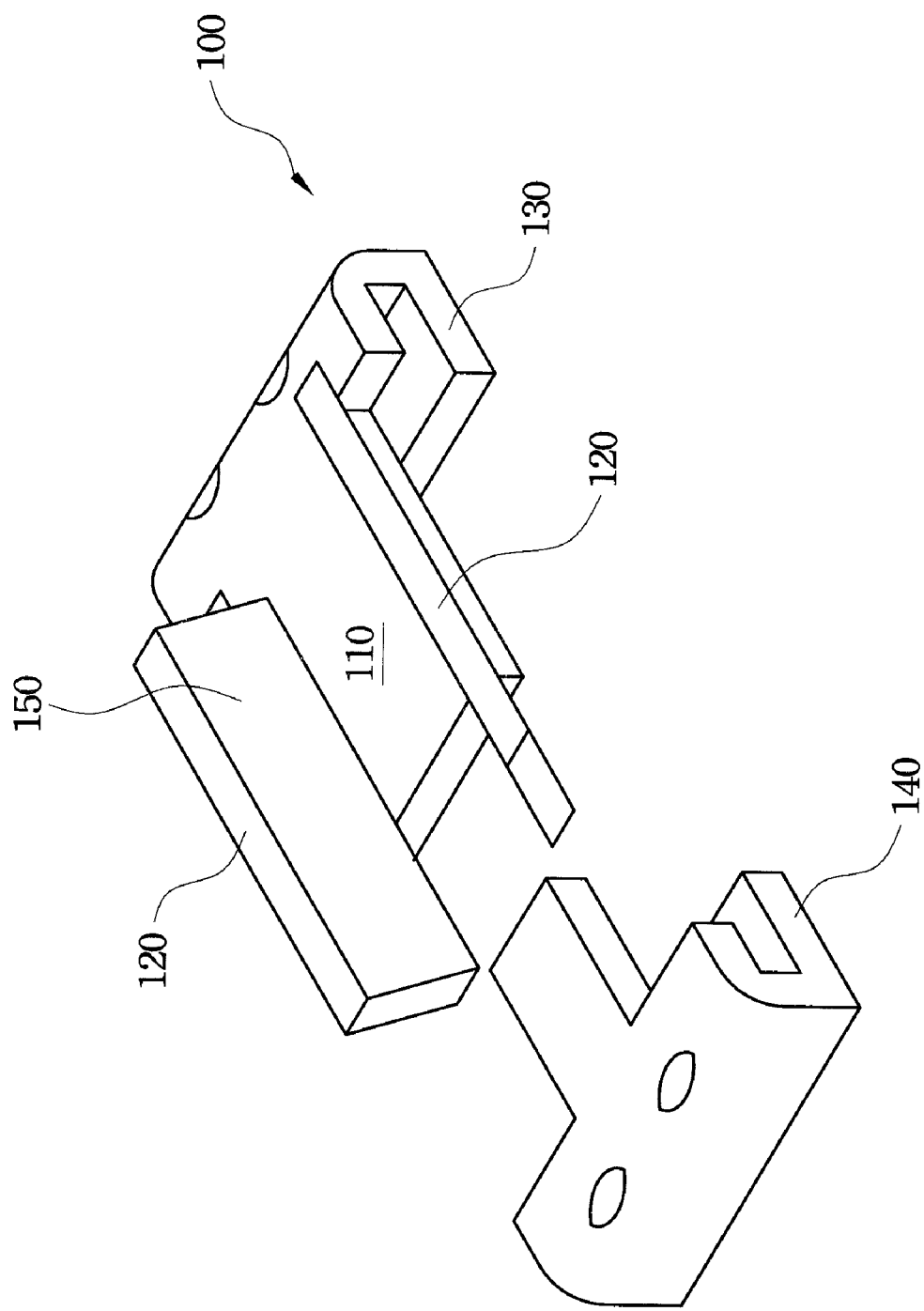
FIG. 2 is a three dimensional view showing a lead frame structure of a light emitting diode according to a first embodiment of the present invention.
Figure 3A:
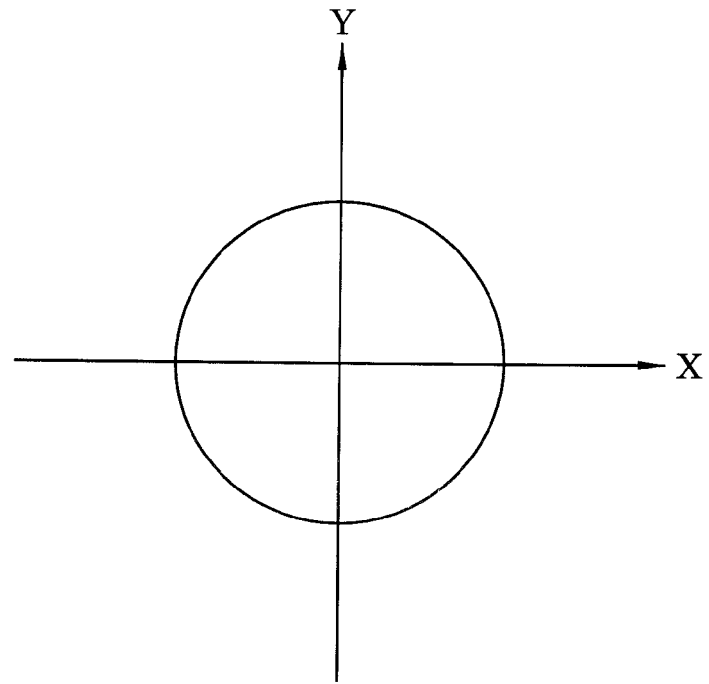
FIG. 3A is a circular light shape view showing the light emitted from a light emitting diode according to a first embodiment of the present invention.
Figure 3B:
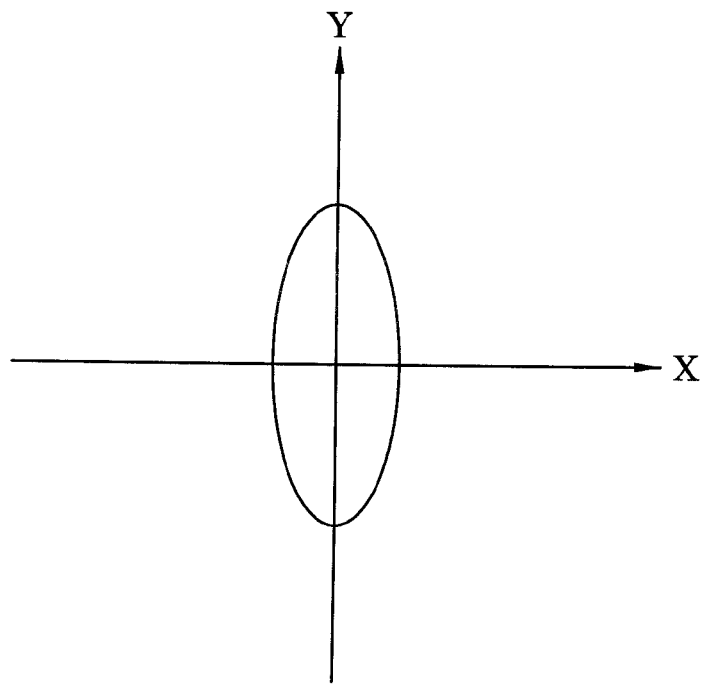
FIG. 3B is an elliptical light shape view showing the light emitted from a light emitting diode according to a first embodiment of the present invention.

Refer to FIG. 1, FIG. 2, FIG. 3A and FIG. 3B. FIG. 1 is a cross-sectional view showing a lead frame structure of a light emitting diode according to a first embodiment of the present invention, FIG. 2 is a three dimensional view showing a lead frame structure of a light emitting diode according to a first embodiment of the present invention, FIG. 3A is a circular light shape view showing the light emitted from a light emitting diode according to a first embodiment of the present invention, and FIG. 3B is an elliptical light shape view showing the light emitted from a light emitting diode according to a first embodiment of the present invention. The lead frame 100 of the first embodiment is made of Au, Ag, Cu, Fe, Al or an alloy thereof formed by a monolithicly forming method, such as punching. The lead frame 100 comprises a bonding zone 110, two wing-shaped reflective surfaces 120, a first electrode lead 130, a second electrode lead 140 and a high reflectivity material layer 150. The bonding zone 110 bonds the light emitting diode 200. The wing-shaped reflective surfaces 120 are formed on two sides of the bonding zone 110 respectively, and a predetermined angle θ is formed between each of the wing-shaped reflective surfaces 120 and the bonding zone 110. The predetermined angle θ is predetermined by an optical analysis (optical simulation or calculation), so that the wing-shaped reflective surfaces 120 can reflect the side light emitted from the light emitting diode 200 towards a predetermined direction, such as forming a top view or a side view light emitting, and further forming a predetermined light shape, such as a rectangle, a polygon, a circle or an elliptical light shape, wherein the predetermined angle θ is substantially between 20 degrees and 70 degrees. The high reflectivity material layer 150 is formed on the wing-shaped reflective surfaces 120 by using the method of coating, so as to raise the surface reflectivity of the wing-shaped reflective surfaces 120 and the light emitting efficiency. The high reflectivity material layer 150 is a silver layer which has a high surface reflectivity, so that the high reflectivity material layer 150 can reflect most of the side light emitted from the light emitting diode 200, thereby reducing the light emission loss in the predetermined direction.

In one embodiment of the present invention, the predetermined angle θ is 30 degrees, so that the wing-shaped reflective surfaces 120 can reflect the side light emitted from the light emitting diode 200 towards the top. Namely, the side light of the light emitting diode 200 is emitted towards the top side after being reflected, thereby enabling the side light thereof to be emitted towards the top side effectively, and thereby raising the light emitting efficiency of the light emitting diode 200 in the top side.

Figure 4:
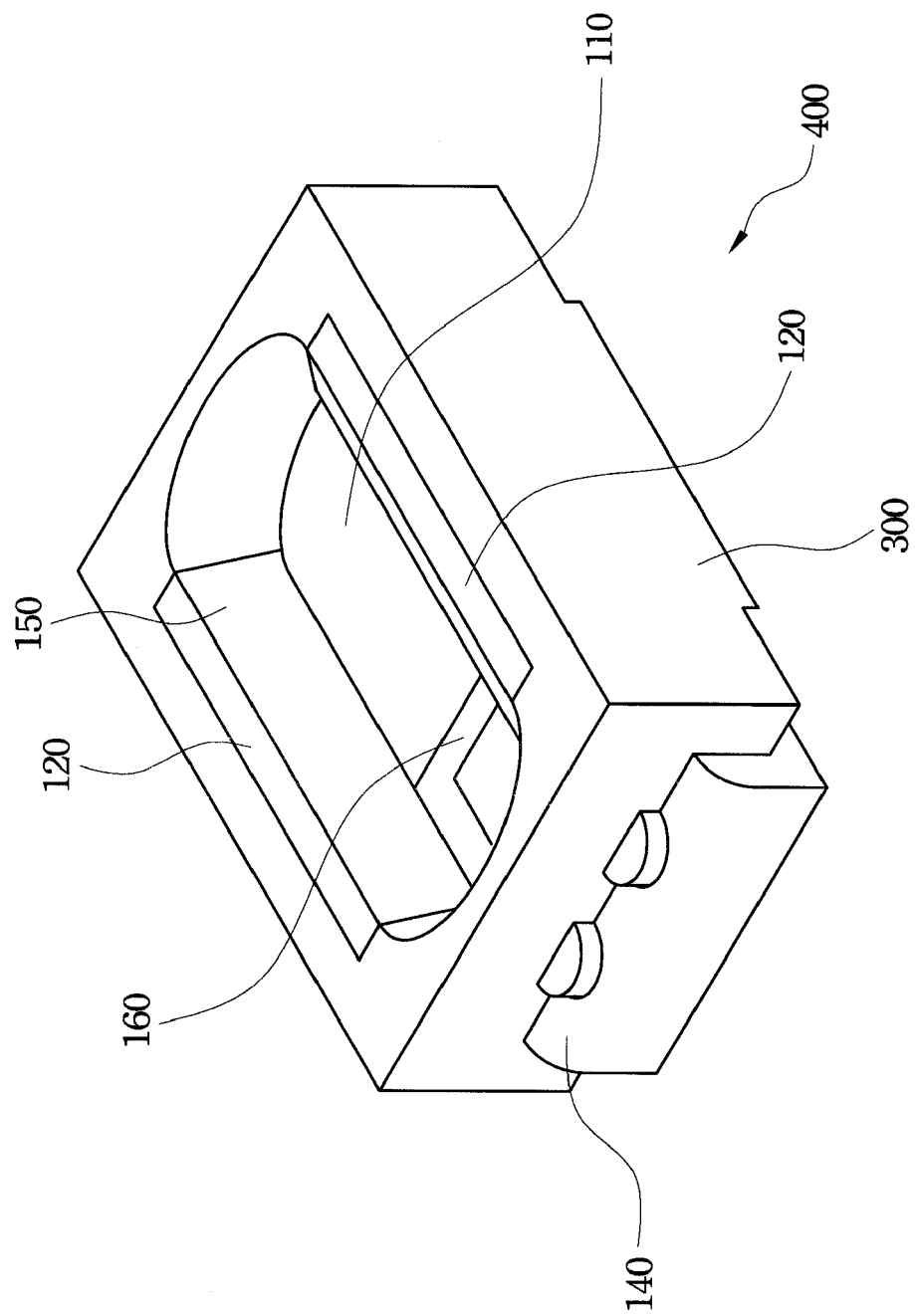
FIG. 4 is a three dimensional view showing a packaging base according to a first embodiment of the present invention.
Figure 5:
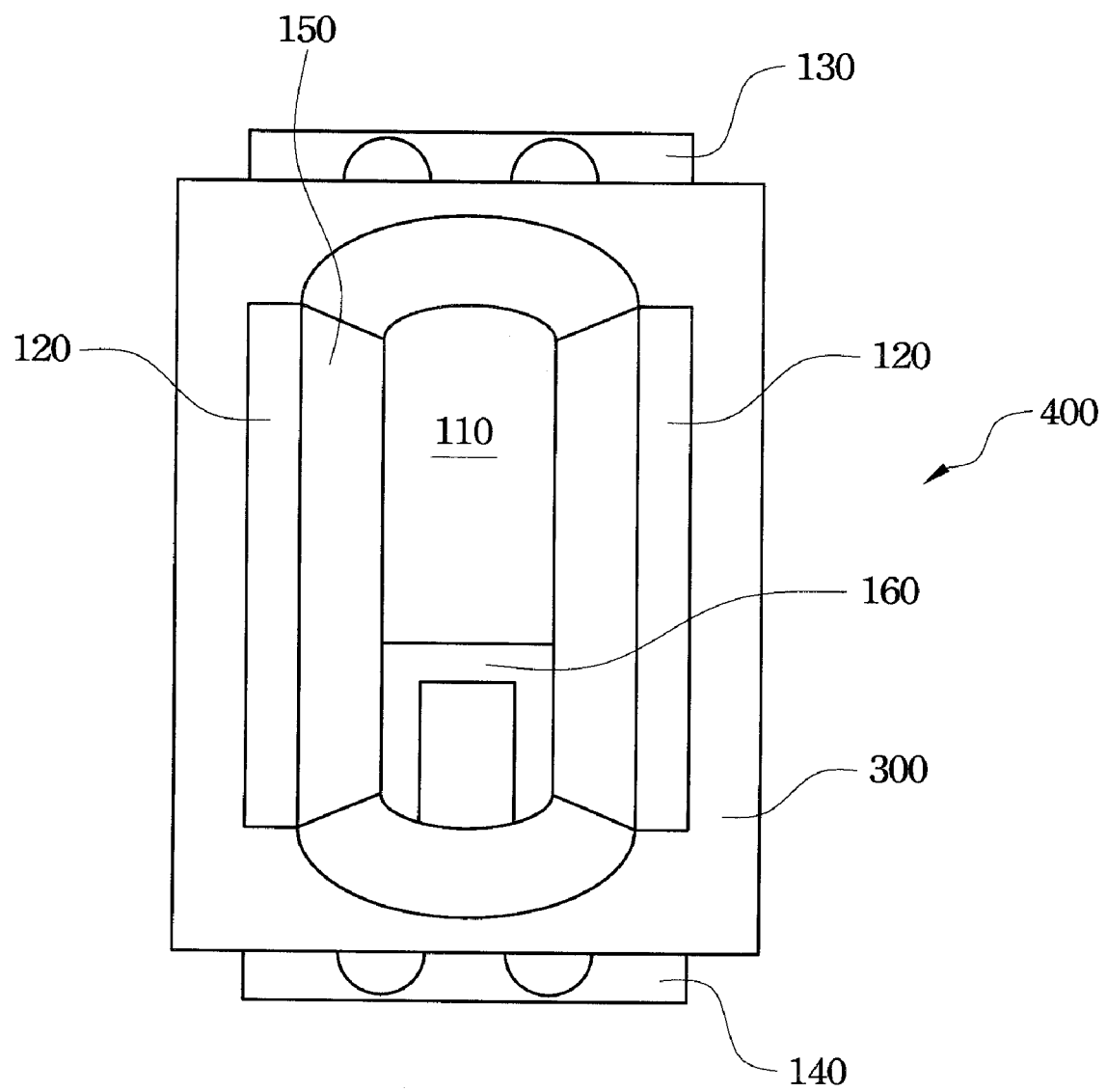
FIG. 5 is a top view showing a packaging base according to a first embodiment of the present invention.

Refer to FIG. 4 and FIG. 5. FIG. 4 is a three dimensional view showing a packaging base according to a first embodiment of the present invention, FIG. 5 is a top view showing a packaging base according to a first embodiment of the present invention. The first electrode lead 130 and the second electrode lead 140 are formed on two other sides of the bonding zone 110, and the first electrode lead 130 is connected to the bonding zone 110, and a gap 160 is formed between the second electrode lead 140 and the bonding zone 110 to separate the first electrode lead 130 from the second electrode lead 140, so that the first electrode lead 130 and the second electrode lead 140 are electrically connected to the anode and the cathode of the light emitting diode 200 respectively and partially exposed out of the packaging base 400. The lead frame 100 is combined with the base body 300, thereby forming the packaging base 400.

Refer to FIG. 4 and FIG. 5 again. The material of the base body 300 may be a high heat-resistant polymer, such as PPA, epoxy resin, glass fiber, titanium oxide, calcium oxide or ceramic material. The base body 300 is formed monolithicly such as by using the method of injecting molding for combining with the lead frame 100, so as to make the packaging base 400 for packaging the light emitting diode 200. The package base 400 is a cup-like structure, and the cross-section shape of the cup-like structure may be a rectangle, a polygon, a circle or an ellipse. Therefore, the light emitted from the light emitting diode 200 can form a predetermined light shape, such as a rectangle, a polygon, a circle or an ellipse. Besides, the package base 400 has an inside surface in the cup-like structure, and the high reflectivity material layer 150 can also be formed on the inside surface to further reflect the side light from the light emitting diode 200.

Therefore, the light emitting diode 200 disposed on the package base 400 can use the wing-shaped reflective surfaces 120 of the lead frame 100 to reflect the side light, thereby raising the light emitting efficiency thereof. Furthermore, the predetermined angle θ is formed between each of the wing-shaped reflective surfaces 120 and the bonding zone 110 to reflect the side light emitted from the light emitting diode 200 towards the predetermined direction, so that the light emitting diode 200 can focus the light on one single direction, thereby avoiding unnecessary emission loss thereof.

In the first embodiment of the present invention, the light emitting diode 200 can be a back-light source of a liquid crystal display (LCD). Since the lead frame 100 of the present invention can effectively reflect the light of the light emitting diode 200 in a single direction, it can avoid unnecessary emission losses and raise the light emitting efficiency of one single light emitting diode 200. Therefore, using the lead frame 100 of the present invention reduces the number of light emitting diodes 200 needed, and the back-light source can still maintain the same brightness for emission, thereby reducing the total cost of the light emitting diodes 200.

Figure 6:
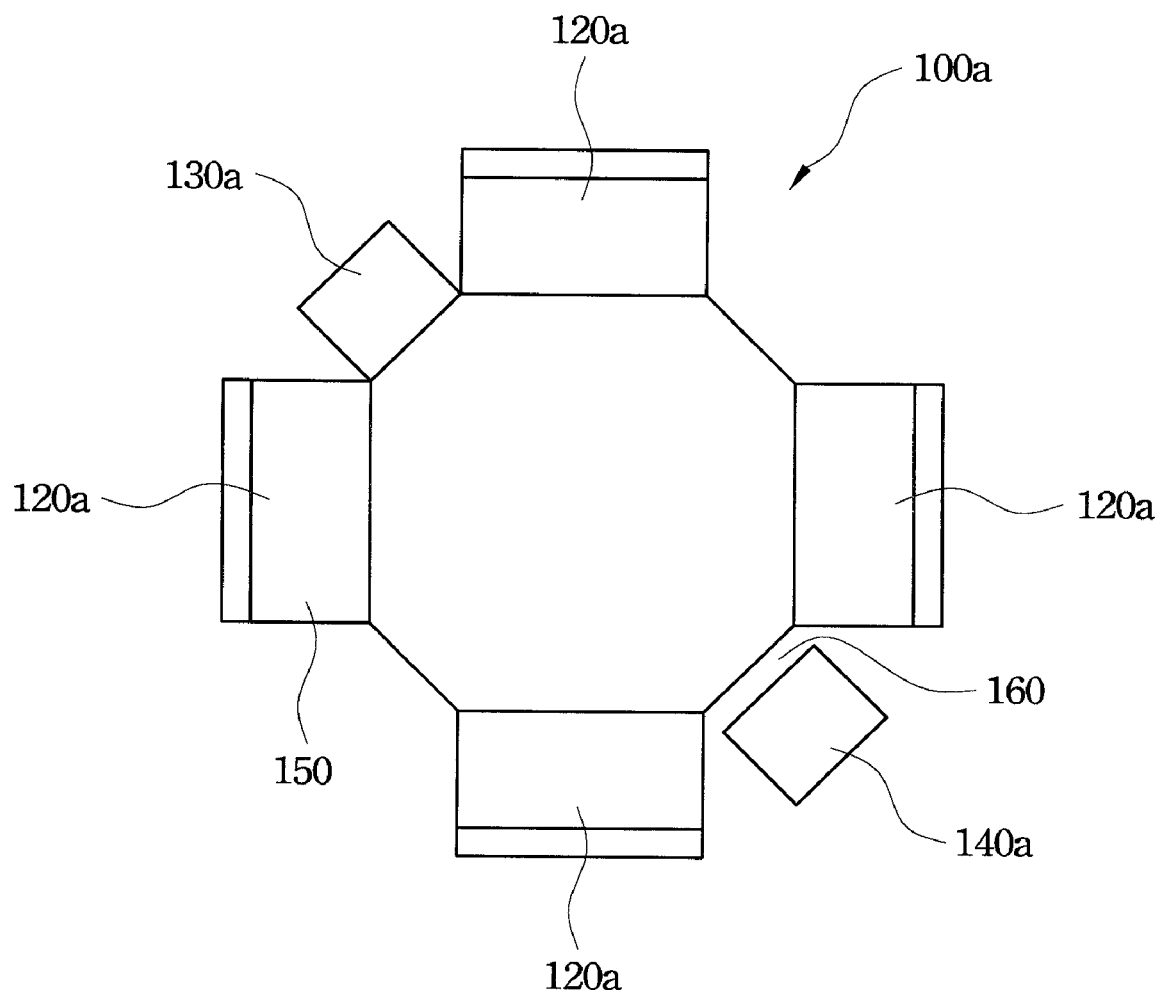
FIG. 6 is a top view showing a lead frame structure of a light emitting diode according to a second embodiment of the present invention.

Refer to FIG. 6. FIG. 6 is a top view showing a lead frame structure of a light emitting diode according to a second embodiment of the present invention. Some reference numerals shown in FIG. 1 are used in the second embodiment of the present invention. The construction of the lead frame structure of the light emitting diode shown in the second embodiment is similar to that in the first embodiment with respect to configuration and function, and thus is not stated in detail herein.

Refer again to FIG. 6, in comparison with the first embodiment, the lead frame 100a has a plurality of wing-shaped reflective surfaces 120a respectively disposed around the bonding zone 110a. The predetermined angle θ is formed between each of the wing-shaped reflective surfaces 120a and the bonding zone 110a. The first electrode lead 130a and the second electrode lead 140a are respectively disposed among the wing-shaped reflective surfaces 120a. Therefore, the wing-shaped reflective surfaces 120a of the second embodiment of the present invention can reflect the side light emitted from the light emitting diode 200 towards a predetermined direction or a predetermined area.

Therefore, the lead frame has the wing-shaped reflective surfaces, and the predetermined angle is formed between each of the wing-shaped reflective surfaces and the bonding zone, thereby reflecting the side light emitted from the light emitting diode effectively and focusing the side light on the predetermined direction. Therefore, the lead frame can prevent that part of the emitting light from being absorbed or lost, and raise the light emitting efficiency greatly. Besides, the high reflectivity material layer on the package base can further reflect the light emitted towards the side from the light emitting diode. Furthermore, the wing-shaped reflective surfaces around the bonding zone can reflect the light towards a predetermined direction or a predetermined area.

As is understood by a person skilled in the art, the foregoing embodiments of the present invention are strengths of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A lead frame structure of a light emitting diode, the lead frame structure comprising:
    a bonding zone for bonding the light emitting diode;
    two wing-shaped reflective surfaces directly connected to the bonding zone, wherein a predetermined angle is formed between each of the wing-shaped reflective surfaces and the bonding zone for reflecting the side light emitted from the light emitting diode towards a predetermined direction, the wing-shaped reflective surfaces are made of a high reflectivity material, and the bonding zone is made of the same high reflectivity material as the wing-shaped reflective surfaces;
    a first electrode lead directly connected to a side of the bonding zone to electrically connect to the light emitting diode; and
    a second electrode lead separated from the first electrode lead by a gap formed between the second electrode lead and the bonding zone.

2. The lead frame structure of a light emitting diode as claimed in claim 1, wherein the predetermined angle is substantially between 20 degrees and 70 degrees.

3. The lead frame structure of a light emitting diode as claimed in claim 2, wherein the predetermined angle is substantially 30 degrees.

4. The lead frame structure of a light emitting diode as claimed in claim 1, wherein the wing-shaped reflective surfaces are formed monolithically by the method of punching.

5. The lead frame structure of a light emitting diode as claimed in claim 1, wherein the lead frame is combined with a base body for forming a package base.

6. The lead frame structure of a light emitting diode as claimed in claim 5, wherein the package base is a cup-like structure, and the cross-section shape of the cup-like structure is selected from a group consisting of a rectangle, a polygon, a circle and an ellipse.

7. The lead frame structure of a light emitting diode as claimed in claim 6, wherein the package base has an inside surface in the cup-like structure, and a high reflectivity material layer is formed on the inside surface.

8. The lead frame structure of a light emitting diode as claimed in claim 1, wherein the high reflectivity material includes a silver layer.

9. A lead frame structure of a light emitting diode, the lead frame structure comprising:
    a bonding zone for bonding the light emitting diode;
    a plurality of wing-shaped reflective surfaces directly connected to the bonding zone, wherein a predetermined angle is formed between each of the wing-shaped reflective surfaces and the bonding zone for reflecting the side light emitted from the light emitting diode towards a predetermined direction, the wing-shaped reflective surfaces are made of a high reflectivity material, and the bonding zone is made of the same high reflectivity material as the wing-shaped reflective surfaces;
    a first electrode lead directly connected to a side of the bonding zone to electrically connect to the light emitting diode; and
    a second electrode lead separated from the first electrode lead by a gap formed between the second electrode lead and the bonding zone.

10. The lead frame structure of a light emitting diode as claimed in claim 9, wherein the predetermined angle is substantially between 20 degrees and 70 degrees.

11. The lead frame structure of a light emitting diode as claimed in claim 10, wherein the predetermined angle is 30 degrees.

12. The lead frame structure of a light emitting diode as claimed in claim 9, wherein the wing-shaped reflective surfaces are formed monolithically by the method of punching.

13. The lead frame structure of a light emitting diode as claimed in claim 9, wherein the lead frame combines a base body, thereby forming a package base.

14. The lead frame structure of a light emitting diode as claimed in claim 13, wherein the package base is a cup-like structure, and the cross-section shape of the cup-like structure is selected from a group consisting of a rectangle, a polygon, a circle and an ellipse.

15. The lead frame structure of a light emitting diode as claimed in claim 14, wherein the package base has an inside surface in the cup-like structure, and a high reflectivity material layer is formed on the inside surface.

16. The lead frame structure of a light emitting diode as claimed in claim 9, wherein the high reflectivity material includes a silver layer.

* * * * *